United States Patent [19]
Clark

[11] Patent Number: 5,986,900
[45] Date of Patent: *Nov. 16, 1999

[54] GROUND LOOP ELIMINATION

[76] Inventor: George E. Clark, 1900 Altra West Rd., Mansfield, Ohio 44903

[ * ] Notice: This patent is subject to a terminal disclaimer.

[21] Appl. No.: 08/881,438

[22] Filed: Jun. 24, 1997

Related U.S. Application Data

[62] Division of application No. 08/459,256, Jun. 2, 1995, Pat. No. 5,644,263, which is a division of application No. 07/945,092, Sep. 15, 1992, Pat. No. 5,422,804, and a continuation-in-part of application No. 07/945,092, Sep. 15, 1992, Pat. No. 5,422,804.

[51] Int. Cl.$^6$ ........................................... H02M 1/14
[52] U.S. Cl. ............................... 363/44; 363/126
[58] Field of Search ............................. 363/44, 125, 126

[56] References Cited

U.S. PATENT DOCUMENTS

| | | | |
|---|---|---|---|
| 4,109,306 | 8/1978 | Mason | 363/126 |
| 4,219,872 | 8/1980 | Engelman | 363/126 |
| 4,471,423 | 9/1984 | Hase | 363/126 |
| 4,555,751 | 11/1985 | Koga et al. | 363/44 |
| 4,819,145 | 4/1989 | Maeba | 363/126 |
| 4,903,186 | 2/1990 | Pullen | 363/126 |
| 5,172,308 | 12/1992 | Tohya | 363/126 |
| 5,422,804 | 6/1995 | Clark | 363/44 |
| 5,644,263 | 7/1997 | Clark | 327/310 |

*Primary Examiner*—Jeffrey Sterrett
*Attorney, Agent, or Firm*—Jerry Semer

[57] ABSTRACT

The inventor has created several power supplied to eliminate or greatly reduce the ground loop problem. The inventor has discovered that the ground loop distortion is caused by the switching from positive to negative in alternating current. What the inventor has found is that just placing a diode across the two terminals of a power supply works to eliminate distortion and the ground loop problem. In the two simplest power supplies, the inventor has places a diode across the output from a half wave inverter. This helps to eliminate the ground loop problem and other distortion. The inventor also shows three other more complicated designs for power supply which include diodes and capacitors.

5 Claims, 4 Drawing Sheets

GROUND LOOP ELIMINATION

This application is a division of Application Ser. No. 08/459,256 Jun. 02,1995 now U.S. Pat. No. 5,644,263 which is a division and continuation-in-part of Application Ser. No. 07/945,092, filed Sep. 15, 1992 now U.S. Pat. No. 5,422,804.

FIELD OF INVENTION

The present invention relates to power supplies device that eliminates crossover distortion and more particularly to a device that solves the ground loop problem.

BACKGROUND OF THE INVENTION

All devices which need current for operation have, up until the time of this invention, an unsolved ground loop problem. It usually consists of varying ghost images or cross over distortion. The usual method of ridding the system of distortion is by filtering the end product. This is like closing the barn door after the cattle have escaped. The inventor's remedy stops the problem distortion at the source by eliminating the ground loop problem with his uniquely designed power supplies. Thus, the object of this invention is to eliminate the ground loop problem. Further, the object of this invention is to greatly reduce the distortion of any electronic device by eliminating the ground loop problem. The invention that achieved this elimination of the ground loop problem is a uniquely designed power supply. The advantage of the inventor's system is that distortion, the power consumption, and the unwanted heating of the device to which the invention is connected, is greatly reduced.

SUMMARY OF INVENTION

The inventor has created several methods to eliminate or greatly reduce to ground loop problem. The inventor has discovered that the ground loop distortion is caused by switching from positive to negative in alternating current. The applicant has devised several power supplies that eliminated or greatly reduce the ground loop distortion in amplified or electronic devices to which they are attached. The simplest of the methods to eliminated the ground loop problem is to attach a diode across the outputs of a power supply. The inventor also shows halfway rectifiers with a diode placed across the outputs. This amplifier will greatly reduce the ground loop problem. The applicant also shows several much more complex power supplies which eliminate the ground loop problem.

DETAILED DESCRIPTION OF THE PREFERRED EMBODIMENT

Figure 1:
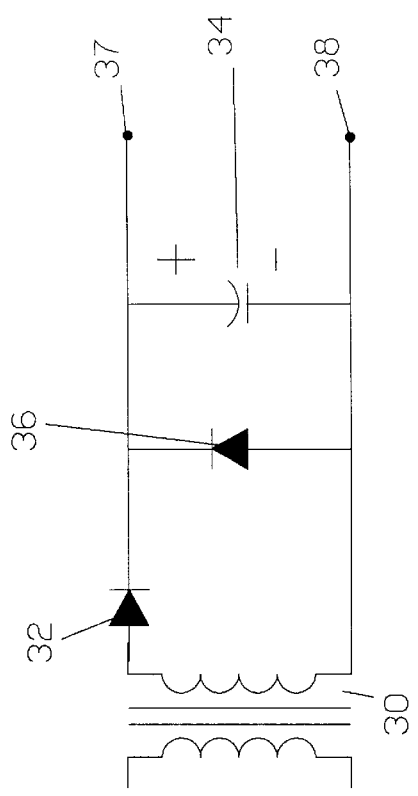
FIG. 1 is a schematic drawing of a power supply of the invention.

Reference is now made to the figures. In the figures all like parts are represented by like reference numerals.

Figure 2:
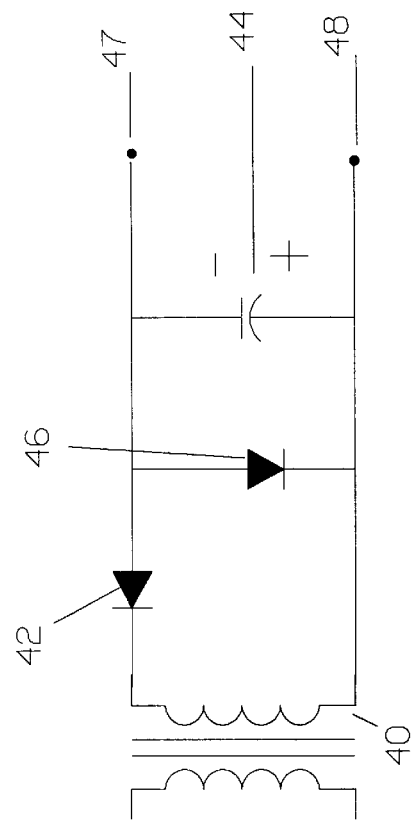
FIG. 2 is a schematic drawing of a power supply of the invention.

A way to cut the ground loop distortion is to modify the power supply. FIG. 1 and FIG. 2 shows the ways of modifying a half wave rectifier power supply. Basically with this design a diode is placed across the output lines beyond the regular half wave rectifier diode. In FIG. 1 diode 32 is the diode of the regular half wave of the rectifier. Diode 36 is then put across the output lines, with its cathode hooked to the positive output 37 and its anode hooked to the negative output 38 in the circuit. Diode 36 is hooked across the output lines with it's cathode end hooked to the cathode diode 32. An electrolytic capacitor is hooked to the two outputs, 37 and 38 of the power supply. In FIG. 2, diode 42, which is he diode of a regular half wave rectifier is placed in the circuit allowing electric to flow in the opposite direction as diode 32. In this case, diode 46 is placed in the circuit to eliminate the ground loop problem and is placed across the output lines 47 and 48 with its anodes attached to the anode of diode 42. The cathode of diode 46 is attached to the positive output 48 and the anode is attached to the negative output 47. Capacitor 44 is attached across the two outputs 47 and 48. By attaching this extra diode, these power supplies will eliminate the ground loop problem in the electronic device.

Figure 3:
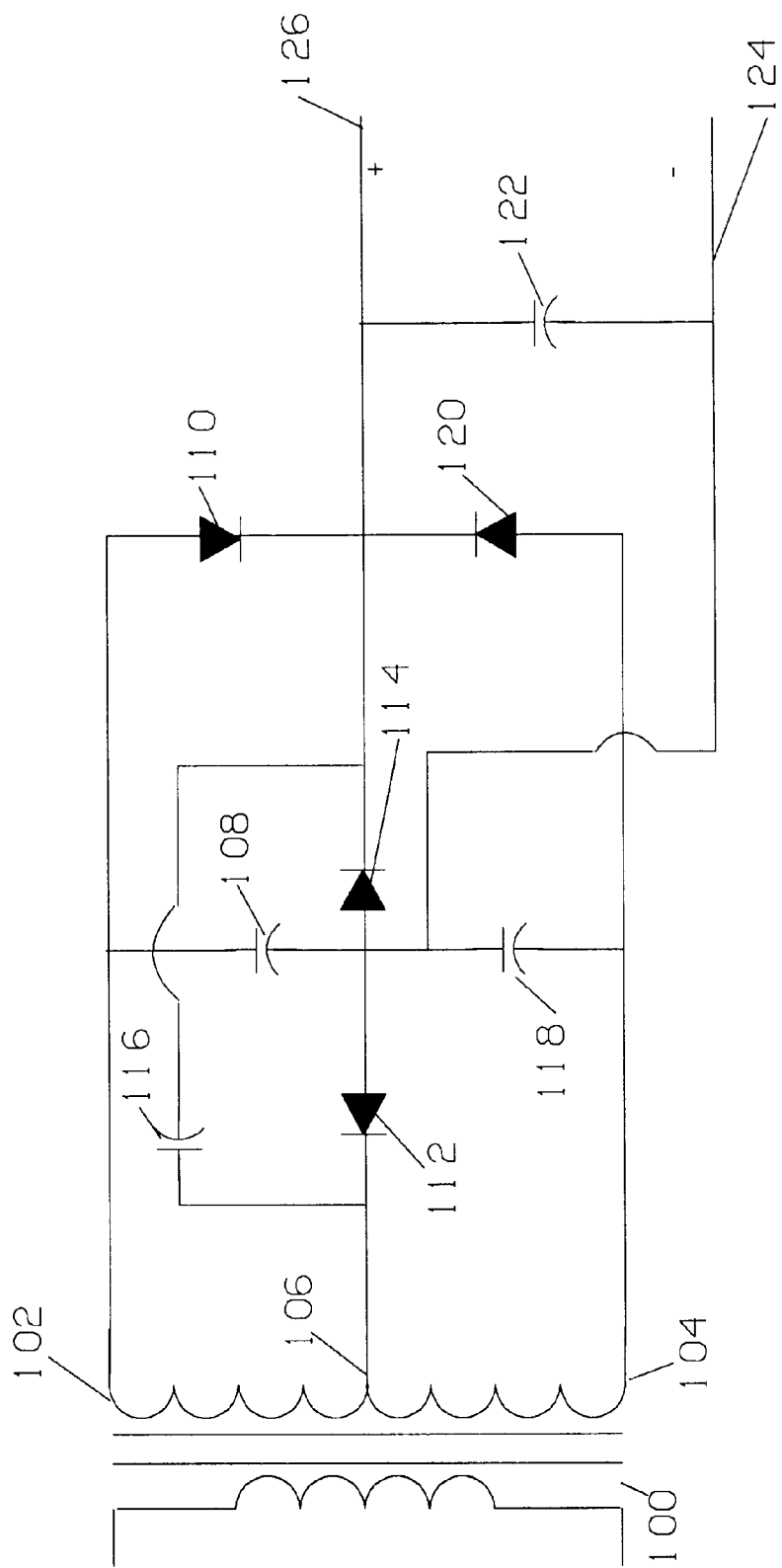
FIG. 3 is a schematic drawing of a power supply of the invention.
Figure 4:
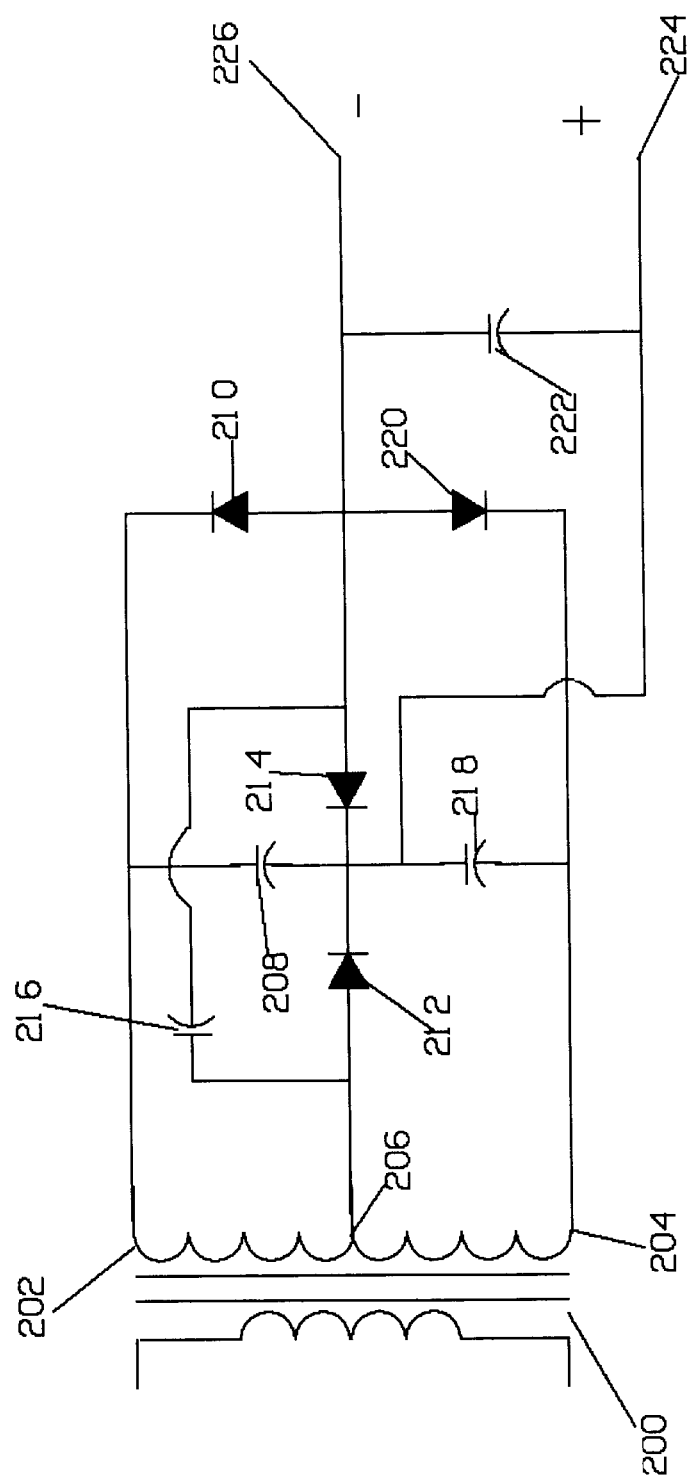
FIG. 4 is a schematic drawing of a power supply of the invention.

FIGS. 3 and 4 show designs of power supply that eliminate the ground loop problem when attached to a electronic device. In FIG. 3 the power supply has a center transformer 100 with outputs 102 and 104 and a center tap 106. Diode 112 cathode is attached to the center tap 106. Diode 112 anode is attached to one of the terminal ends of capacitor 108 and the other end of capacitor 108 is attached to the output of the transformer 102. Diode 112 anode is also attached to diode 114 anode. Capacitor 116 is attached to the cathode of diode 112 and center tap 106 at one terminal end and the cathode of diode 114 at the other terminal end. Diode 110 anode is attached to output 102 of the transformer and capacitor 108. The cathode of diode 1 10 is attached to the cathode of diode 120 and diode 114 and capacitor 116. The negative output of the power supply 124 is attached to the anode of diodes 112 and 114 and a terminal end of capacitor 108 and capacitor 118. Capacitor 118 other terminal end is attached to output 104 of the transformer. Diode 120 cathode is attached to the cathode of diode 110 and the cathode of diode 114 and capacitor 116. Diode 120 anode is attached to output 104 of the transformer and a tenninal end of capacitor 118. A positive output of the power supply is attached to the cathode of diodes 110, 114 and 120 as well as capacitor 116. A electrolytic capacitor 122 is attached across the positive output of the power supply 126 and the negative output of the power supply 124. Capacitor 122 positive terminal end is attached to the positive output of the power supply 126 and capacitor 122 negative terminal end is attached to the negative output of the power supply 124.

Another embodiment of a power supply that when attached to a electronic device will eliminate the ground loop problem is shown in FIG. 3. In this figure the diodes are attached to allow the flow of electric in the opposite directing of the diode in FIG. 3. The power supply in FIG. 3 shows a center tap transformer 200 with outputs 202 and 204 and a center tap 206. Attached to center tap 206 is the anode of diode 212. Attached to the cathode of diode 212 is cathode of diode 214 and capacitors 208 and 218. Capacitor 208 other terminal end is attached to the output 202 of the transformer. The other terminal end of capacitor 218 is attached to output 204 of the transformer. Also attached to the cathode of diode 212 is the positive output of this power supply 224. One of the terminal ends of capacitor 216 is attached to the center tap 206 and the anode of diode 212.

The other terminal end of capacitor 216 is attached to the anode of diode 214. Also attached to the anode of 214 and capacitor 216 are the anode of diodes 210 and 220. The cathode of diode 210 is attached to capacitor 208 and output 202 of the transformer. The cathode of diode 220 is attached to capacitor 218 and output 204 of the transformer. A negative output of the power supply is attached to the anodes of diodes 210, 220 and 214 and capacitor 216. An electrolytic capacitor 222 is attached across the output of the power supply 226 and 224. The negative terminal end of electrolytic capacitor 222 is attached to the negative output 226 of the power supply and the positive terminal end of capacitor 222 is attached to output 224 the positive output of the power supply.

Figure 5:
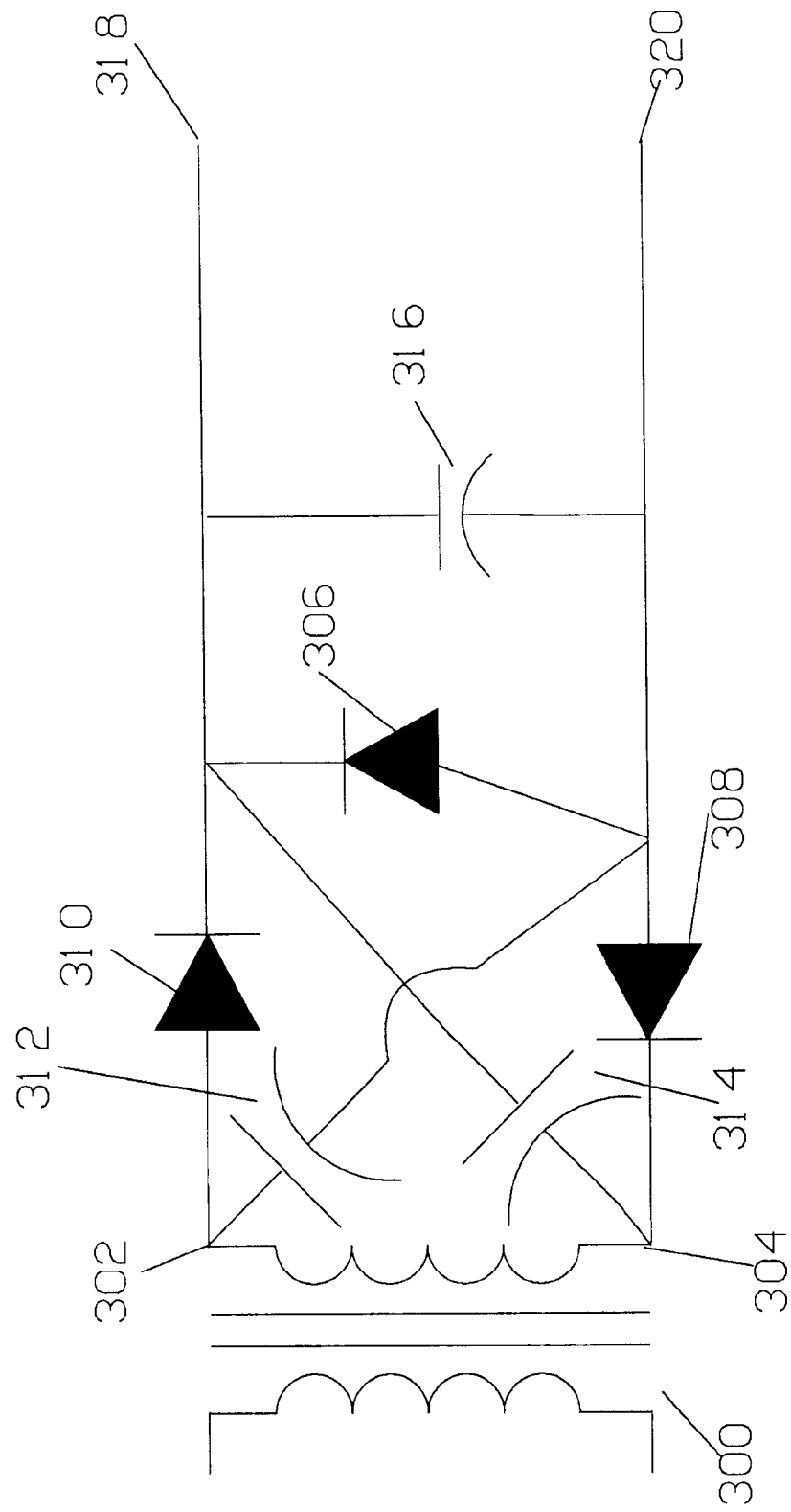
FIG. 5 is a schematic drawing of a power supply of the invention.

Another power supply that reduces the ground loop distortion when attached to an electronic device is shown in FIG. 5. This power supply is for a transformer without a center tap. Transformer 300 has outputs 302 and 304. Output 302 of the transformer is attached to bipolar capacitor 312 and diode 310. Output of transformer 304 is attached to bipolar capacitor 314 and diode 308. Capacitor 312 as stated before is attached at one terminal end to output of the transformer 302 and diode 310. Its other terminal end is attached to diode 308. Bipolar capacitor 314 is attached at one terminal end to output of the transformer 304 and diode 308 and at the other end is attached to diode 310. Diode 308 at one terminal end is attached to bipolar capacitor 314 and output of the transformer 304 and at diode 308 the other terminal end is attached to bipolar capacitor 312. Diode 310 is attached at one terminal end to the output of the transformer 302 and to bipolar capacitor 312 and at the other end is attached to bipolar capacitor 314. Diode 306 at one terminal end is attached to bipolar capacitor 314 and diode 310 and at the other terminal end is attached to bipolar capacitor 312 and diode 308. One of the output of the power supply 318 is attached to diode 306, bipolar capacitor 314 and diode 310. The other output of the power supply 320 is attached to diode 306, bipolar capacitor 312 and diode 308. Across outputs 318 and 320 a capacitor 316 is attached.

Changes and modification in specifically described embodiment can be carried out without departing from the scope of the invention which is intended to be limited only by the scope by the appending claims.

I claim:

1. A power supply for reducing the ground loop and other distortion in an electronic device comprising:
   a. a transformer with a first and second output and a center tap;
   b. a first diode attached to the center tab;
   c. a first capacitor with two terminal ends is attached to the first output of the transformer at one terminal end and the first diode at the other terminal end;
   d. a second diode attached to the first diode and the first capacitor;
   e. a second capacitor with two terminal ends is attached to the center tab and the first diode at one terminal end and the second diode at the other terminal end;
   f. a third diode with two terminal ends is attached to the first capacitor and the first output of the transformer at one terminal end and said third diode is attached to the second capacitor and the second diode at the other terminal end;
   g. a third capacitor with two terminal ends attached to the first and second diode at one terminal end and the second output of the transformer at the other terminal end;
   h. a first output of the means for supplying power attached to the first and second diode and the third capacitor;
   i. a forth diode with two terminal ends attached to the third diode and the second diode and the second capacitor at one terminal end and the third capacitor and the second output of the transformer at the other end terminal end;
   j. a second output of the power supply attached to the third and fourth diodes and the second capacitor; and,
   k. a fourth capacitor attached to the first and second outputs of the power supply.

2. A power supply for reducing the ground loop and other distortion in an electronic device comprising:
   a power supply with a rectifying section which has outputs and,
   b. a diode attached across the outputs of the rectifying section of the power supply of the electronic device.

3. A power supply for reducing the ground loop and other distortion in an electronic device as in claim 2 wherein:
   a. the power supply is a half wave rectifier; and
   b. the diode is placed between the positive and negative output of the halfwave rectifier such that the cathode of the diode is attached to the positive output and the anode of the diode is attached to the negative output.

4. A power supply that reduces the ground loop and other distortion in an electronic device comprising:
   a. a transformer with a first and second output;
   b. a first diode attached to the first output of the transformer;
   c. a second diode attached to the first diode;
   d. a third diode with two terminal ends is attached at one terminal end to the second output of the transformer and at the other terminal end to the second diode;
   e. a first capacitor with two terminal ends is attached at one end to the first output of the transformer and at the second terminal end to the second and third diode;
   f. a second capacitor with two terminal ends whose one terminal end is attached to the second output of the transformer and the third diode and whose other terminal end is attached to the first and second diode;
   g. a first output of the power supply attached to the first and second diode and the second capacitor;
   h. a second output of the power supply attached to the second and third diode and the first capacitor; and,
   i. a capacitor attached to the first and second outputs of the power supply.

5. A power supply for reducing ground loop and other distortion in an electronic device as in claim 4 wherein:
   a. the first and second capacitors are bipolar capacitors.

* * * * *